United States Patent
Xu

(10) Patent No.: US 10,699,905 B2
(45) Date of Patent: Jun. 30, 2020

(54) LOW-TEMPERATURE POLYSILICON (LTPS), THIN FILM TRANSISTOR (TFT), AND MANUFACTURING METHOD OF ARRAY SUBSTRATE

(71) Applicant: SHENZHEN CHINA STAR OPTOELECTRONICS TECHNOLOGY CO., LTD., Shenzhen, Guangdong (CN)

(72) Inventor: Xiangyang Xu, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 111 days.

(21) Appl. No.: 16/088,673

(22) PCT Filed: Aug. 30, 2018

(86) PCT No.: PCT/CN2018/103164
§ 371 (c)(1),
(2) Date: Sep. 26, 2018

(87) PCT Pub. No.: WO2019/174195
PCT Pub. Date: Sep. 19, 2019

(65) Prior Publication Data
US 2020/0168456 A1    May 28, 2020

(30) Foreign Application Priority Data
Mar. 12, 2018    (CN) .......................... 2018 1 0202160

(51) Int. Cl.
*H01L 21/02* (2006.01)
*H01L 27/12* (2006.01)

(52) U.S. Cl.
CPC .. *H01L 21/02678* (2013.01); *H01L 21/02488* (2013.01); *H01L 21/02502* (2013.01);
(Continued)

(58) Field of Classification Search
None
See application file for complete search history.

(56) References Cited

U.S. PATENT DOCUMENTS

| 2006/0105551 A1* | 5/2006 | Sun | C30B 13/00 438/482 |
| 2009/0117692 A1* | 5/2009 | Koyama | H01L 21/2007 438/164 |
| 2012/0289006 A1* | 11/2012 | Yuan | H01L 27/1288 438/158 |

FOREIGN PATENT DOCUMENTS

| CN | 1501437 A | 6/2004 |
| CN | 106024708 A | 10/2016 |

(Continued)

*Primary Examiner* — Herve-Louis Y Assouman
(74) *Attorney, Agent, or Firm* — Leong C. Lei

(57) ABSTRACT

The present disclosure relates to a LTPS, a TFT and a method for manufacturing an array substrate. The method for manufacturing LTPSs includes: providing a substrate, forming a buffer layer on the substrate; forming an amorphous silicon layer on the buffer layer; and performing an excimer laser annealing treatment on the amorphous silicon layer under the shielding of a semi-translucent mask. The laser annealing process converts the amorphous silicon layer into a polysilicon layer. The semi-translucent membrane includes a semi-translucent substrate and a patterned semi-translucent film disposed on the surface of the substrate. The present disclosure also provides a corresponding LTPS TFT and an array substrate manufacturing method. The LTPS, the TFT and the array substrate manufacturing method may enhance the polysilicon crystal effect better, improve the (Continued)

electrical performance of the polysilicon TFT, and the dry etching efficiency of the polysilicon layer.

9 Claims, 3 Drawing Sheets

(52) U.S. Cl.
 CPC .. *H01L 21/02505* (2013.01); *H01L 21/02532* (2013.01); *H01L 21/02592* (2013.01); *H01L 27/1262* (2013.01); *H01L 27/1274* (2013.01)

(56) References Cited

FOREIGN PATENT DOCUMENTS

| | | |
|---|---|---|
| CN | 106847746 A | 6/2017 |
| CN | 106876480 A | 6/2017 |
| CN | 108346562 A | 7/2018 |

* cited by examiner

LOW-TEMPERATURE POLYSILICON (LTPS), THIN FILM TRANSISTOR (TFT), AND MANUFACTURING METHOD OF ARRAY SUBSTRATE

RELATED APPLICATIONS

The present application is a National Phase of International Application Number PCT/CN2018/103164, filed Aug. 30, 2018, and claims the priority of China Application No. 201810202160.2, filed Mar. 12, 2018.

BACKGROUND

1. Technical Field

The present disclosure relates to display technology field, and more particularly to a low-temperature polysilicon (LTPS), thin film transistors (TFTs) and a manufacturing method of array substrates.

2. Description of Related Art

The Thin Film Transistors (TFT) is a main driving component current for liquid crystal display devices (LCDs) and active matrix organic electroluminescent display devices, which are directly related to the display performance of flat panel display devices. The TFT has a variety of structures, and there are a plurality of material for preparing the TFT having a corresponding structure. According to the material of the active layer, the TFT can be classified into an amorphous silicon TFT, a polysilicon TFT, and the like.

Compared with amorphous silicon TFTs, polysilicon TFTs have higher electron mobility, faster response time, and higher resolution, and have been widely used in display devices as switching elements in the driving circuit. The polysilicon TFT manufacturing method generally uses a low temperature polysilicon (LTPS) method, in which an amorphous silicon layer is generally formed by chemical vapor deposition (CVD), and the amorphous silicon layer is subjected to crystallization treatment. At present, the crystallization is generally performed using an excimer laser annealing (ELA) technique. After the amorphous silicon layer is irradiated by the 308 nm laser, it is melted to form an amorphous silicon liquid. When the amorphous silicon liquid is cooled, the amorphous silicon liquid gradually crystallizes and grows. A polysilicon layer is formed. The current excimer laser annealing is mainly laser irradiation crystallized over the entire surface. The biggest defect of this crystal is its poor homogeneity and it is difficult to apply to large-size panels.

As shown in FIG. 1, a low-temperature polysilicon production process is currently performed. First, a buffer layer 20 is formed on the glass substrate 10 by a (CVD) method. The buffer layer 20 may be of a dual-layer structure of SiNx/SiO2 having a thickness of 1000 angstroms to 2000 angstroms or of a triple-layer structure of SiNx/SiNO/SiO2. The CVD method is adopted to form an amorphous silicon layer 30 with a thickness of 300 Å to 800 Å. Finally, an excimer laser annealing device, namely, a laser 40 is used at room temperature and under atmospheric pressure. The amorphous silicon layer 30 is laser annealed and crystallized to form a polysilicon layer.

SUMMARY

The present disclosure relates to a manufacturing method of LTPS, a manufacturing method of LTPS TFTs, and a manufacturing method of LTPS TFT array substrate to enhance the polysilicon crystal performance In one aspect, a low-temperature polysilicon (LTPS) manufacturing method includes:

providing a substrate, and forming a buffer layer on the substrate; forming an amorphous silicon layer on the buffer layer; performing an excimer laser annealing treatment on an amorphous silicon layer under a shielding of the semi-translucent mask to transform the amorphous silicon layer into a polysilicon layer; and the semi-translucent mask includes a translucent substrate and a patterned semi-translucent membrane disposed on a surface of the substrate.

Wherein a pattern of the semi-translucent membrane corresponds to a non-silicon island region of the amorphous silicon layer.

Wherein a thickness of the buffer layer is in a range between 1000 Å and 2000 Å.

Wherein the buffer layer is of a dual-layer structure of SiNx/SiO2.

Wherein the buffer layer is of a triple-layer structure of SiNx/SiNO/SiO2.

Wherein a thickness of the amorphous silicon layer is in a range between 300 angstroms and 800 angstroms.

Wherein, the substrate is translucent marble substrate.

In another aspect, a manufacturing method of LTPS TFTs, wherein a LTPS layer is manufactured by the above-mentioned LTPS manufacturing method.

In another aspect, a manufacturing methods of LTPS TFT array substrates, wherein the LTPS TFTs are manufactured by the above-mentioned manufacturing method of LTPS TFTs.

To sum up, the low-temperature polysilicon, the TFT and the array substrate manufacturing method of the present disclosure can make the polysilicon crystal performance better, improve the electrical properties of the polysilicon TFT, and at the same time, can improve the dry etching efficiency of the polysilicon layer and release the production polysilicon. The production capacity.

BRIEF DESCRIPTION OF THE DRAWINGS

In order to more clearly illustrate the embodiments of the present disclosure or prior art solutions, the drawings used in the description of the embodiments or prior art will be briefly described below. The drawings are merely some embodiments of the present disclosure, and those skilled in the art can also obtain other drawings based on these drawings without any creative work.

DETAILED DESCRIPTION

Following embodiments of the invention will now be described in detail hereinafter with reference to the accompanying drawings.

Figure 1:
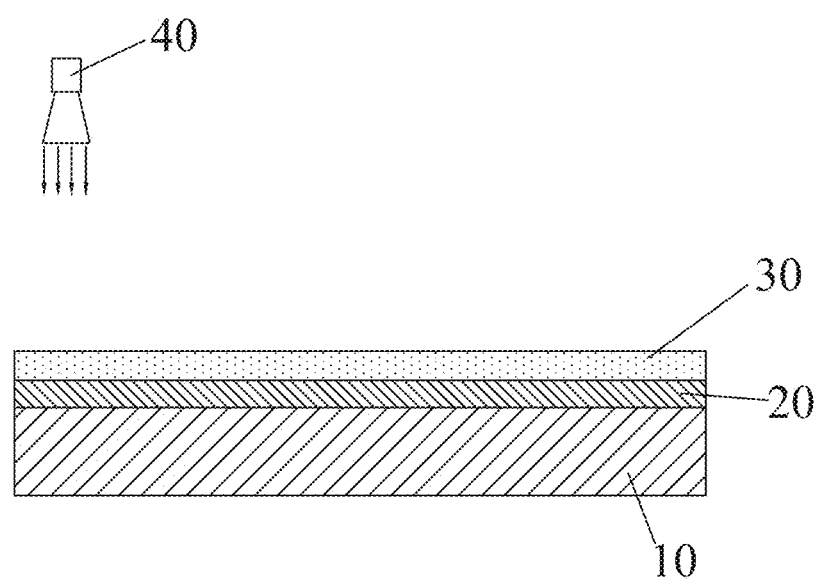
FIG. 1 is a schematic view of the manufacturing method of the conventional LTPS.
Figure 2:
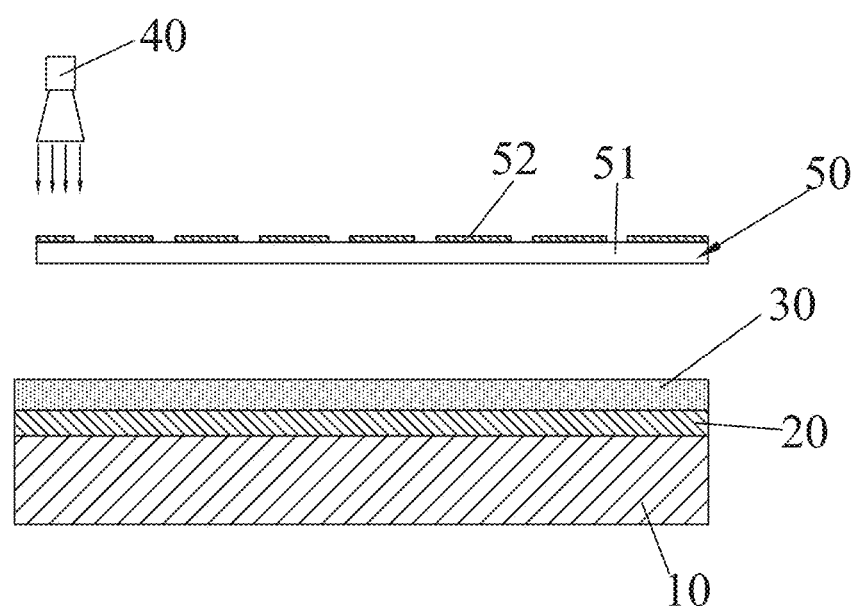
FIG. 2 is a schematic view of the manufacturing method of the LTPS in accordance with one embodiment of the present disclosure.

Referring to FIG. 2, which is a schematic diagram of a low-temperature polysilicon production process in accordance with one embodiment of the present disclosure. The low-temperature polysilicon manufacturing method provides an annealing method for improving the crystal uniformity of a polysilicon layer, which mainly includes:

A substrate 10 is provided on which a buffer layer 20 is formed. First, a dual-layer buffer layer of SiNx/SiO2 or a triple-layer buffer layer of SiNx/SiNO/SiO2 having a thickness in a range between 1000 Å and 2000 Å may be formed on a glass substrate by a (CVD) method.

An amorphous silicon layer 30 is formed on the buffer layer 20. The amorphous silicon layer 30 may be deposited on the buffer layer 20 by a (CVD) method, and the amorphous silicon layer 30 may have a thickness of 300 angstroms to 800 angstroms.

The excimer laser annealing process is performed on the amorphous silicon layer 30 under the shielding of the semi-translucent mask 50 to convert the amorphous silicon layer 30 into a polysilicon layer. An excimer laser is emitted by the laser 40 and then transmitted through the semi-translucent mask 50 to apply the laser annealing process to the amorphous silicon layer 30 while being shielded by the semi-translucent mask 50.

The semi-translucent mask 50 includes a translucent substrate 51 and a patterned semi-translucent membrane 52 provided on a surface of the translucent substrate 51. The semi-translucent mask 50 is the same as the conventional photolithography mask design method. The substrate 51 may be a translucent marble substrate. The semi-translucent film 52 partially absorbs the laser energy, thereby generating an irradiation on the amorphous silicon layer 30 having a temperature gradient. Since the finally formed polysilicon layer is the active layer of the TFT, the semi-translucent membrane region on the semi-translucent mask 50 corresponds to the non-silicon island region of the active layer, and the non-translucent membrane of the semi-translucent mask 50 is formed. The region corresponds to the island region of the active layer, that is, the patterned semi-translucent film 52 corresponds to the non-silicon island region of the amorphous silicon layer 30. By using the semi-translucent mask 50, full laser irradiation can be performed in the silicon island area, and semi-permeable membrane shielding and annealing is performed in other areas, so that the temperature of the silicon island area of the amorphous silicon layer 30 is higher than that of other areas.

To improve the production effect, the low-temperature polysilicon production method of the present disclosure may also include common steps in the existing processes, such as dehydrogenating the amorphous silicon layer, which will not be described here.

Figure 3:
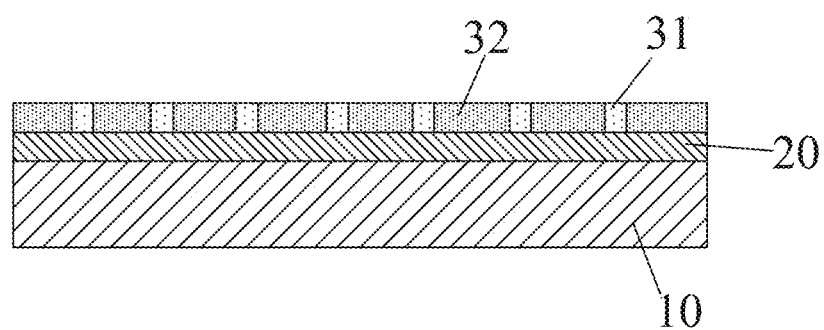
FIG. 3 is a schematic view of the structure of the LTPS in accordance with one embodiment of the present disclosure.

FIG. 3 is a schematic view of the structure of the LTPS in accordance with one embodiment of the present disclosure. In FIG. 3, the amorphous silicon layer 30 on the substrate 10 and the buffer layer 20, after the annealing process, is shown. Since the temperature in the silicon island region is higher than that in other regions, the temperature gradient makes the silicon island region have a better crystallization effect, and the polysilicon 31 in the silicon island region is formed, which can improve the electrical properties of the polysilicon TFT. At the same time, since the temperature of the non-silicon island region is relatively low, the crystallinity is poor, and the polysilicon 32 in the non-silicon island region is formed, so that etching is easier, the dry etching efficiency of the polysilicon layer can be improved, and the production capacity of manufacturing polysilicon can be released.

With the low-temperature polysilicon production method of the present disclosure, a low-temperature polysilicon TFT and an array substrate with better polysilicon crystal performance can be correspondingly manufactured.

In summary, the present disclosure relates to a low temperature polysilicon TFT and a method of manufacturing an array substrate that may be better crystallized polysilicon, so to improve the electrical properties of the polycrystalline silicon TFT, while the efficiency of dry-etching may be better to enhance the production capacity of polysilicon.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A low-temperature polysilicon (LTPS) manufacturing method, comprising:
   providing a substrate, and forming a buffer layer on the substrate;
   forming an amorphous silicon layer on the buffer layer; and
   performing an excimer laser annealing treatment on an amorphous silicon layer under shielding of the semi-translucent mask to transform the amorphous silicon layer into a polysilicon layer;
   wherein the semi-translucent mask comprises a translucent substrate and a patterned semi-translucent membrane disposed on a surface of the transparent substrate to cover a first portion of the translucent substrate, while exposing a second portion of the translucent substrate that is different from the first portion, wherein laser passes through the first portion of the translucent substrate and the patterned semi-translucent membrane to induce a first level of crystallization of a first part of the amorphous silicon layer corresponding to the first portion and the laser also passes through the second portion of the translucent substrate to induce a second level of crystallization of a second part of the amorphous silicon layer corresponding to the second portion, the second level of crystallization being different from the first level of crystallization.

2. The LTPS manufacturing method as claimed in claim 1, wherein a pattern of the semi-translucent membrane corresponds to a non-island region of the amorphous silicon layer.

3. The LTPS manufacturing method as claimed in claim 1, wherein a thickness of the buffer layer is in a range between 1000 Å and 2000 Å.

4. The LTPS manufacturing method as claimed in claim 1, wherein the buffer layer is of a dual-layer structure of SiNx/SiO2.

5. The LTPS manufacturing method as claimed in claim 1, wherein the buffer layer is of a triple-layer structure of SiNx/SiNO/SiO2.

6. The LTPS manufacturing method as claimed in claim 1, wherein a thickness of the amorphous silicon layer is in a range between 300 angstroms and 800 angstroms.

7. The LTPS manufacturing method as claimed in claim 1, wherein, the substrate is translucent marble substrate.

8. A manufacturing method of LTPS thin film transistors (TFTs), wherein a LTPS layer is manufactured by the LTPS manufacturing method according to claim 1.

9. A manufacturing methods of LTPS TFT array substrates, wherein the LTPS TFTs are manufactured by the manufacturing method of LTPS TFTs according to claim 8.

* * * * *